US006952797B1

(12) United States Patent
Kahn et al.

(10) Patent No.: US 6,952,797 B1
(45) Date of Patent: Oct. 4, 2005

(54) BLOCK-APPENDED CHECKSUMS

(76) Inventors: Andy Kahn, 2250 Monroe St., Santa Clara, CA (US) 95050; Rajesh Sundaram, 2730 Doverton Sq., Mountain View, CA (US) 94040; Srinivasan Viswanathan, 751 Saltillo Pl., Fremont, CA (US) 94536; Steven R. Kleiman, 157 El Monte Rd., Los Altos, CA (US) 94022

( * ) Notice: Subject to any disclaimer, the term of this patent is extended or adjusted under 35 U.S.C. 154(b) by 307 days.

(21) Appl. No.: 09/696,666

(22) Filed: Oct. 25, 2000

(51) Int. Cl.[7] .......................... G11C 29/00; H03M 13/00
(52) U.S. Cl. ........................................ 714/770; 714/758
(58) Field of Search ................................. 714/770, 758

(56) References Cited

U.S. PATENT DOCUMENTS

| | | | |
|---|---|---|---|
| 4,761,785 A | 8/1988 | Clark et al. | |
| 5,088,081 A | 2/1992 | Farr | |
| 5,195,100 A | 3/1993 | Katz et al. | |
| 5,208,813 A | 5/1993 | Stallmo | |
| 5,235,601 A | 8/1993 | Stallmo et al. | |
| 5,239,640 A | 8/1993 | Froemke et al. | |
| 5,278,838 A | 1/1994 | Ng et al. | |
| 5,283,791 A * | 2/1994 | Halford | 714/766 |
| 5,313,626 A | 5/1994 | Jones et al. | |
| 5,341,381 A | 8/1994 | Fuller | |
| 5,386,425 A * | 1/1995 | Kim | 714/755 |
| 5,392,290 A * | 2/1995 | Brown et al. | 714/6 |
| 5,517,484 A | 5/1996 | Takagi et al. | |
| 5,537,567 A | 7/1996 | Galbraith et al. | |
| 5,666,511 A * | 9/1997 | Suganuma et al. | 711/114 |
| 5,675,726 A | 10/1997 | Hohenstein et al. | |
| 5,696,775 A | 12/1997 | Nemazie et al. | |
| 5,758,057 A * | 5/1998 | Baba et al. | 714/7 |
| 5,765,183 A | 6/1998 | Kojima et al. | |
| 5,864,440 A * | 1/1999 | Hashimoto et al. | 360/53 |
| 5,864,655 A * | 1/1999 | Dewey et al. | 714/7 |
| 5,903,532 A | 5/1999 | Ikeda | |
| 5,948,110 A | 9/1999 | Hitz et al. | |
| 5,963,962 A | 10/1999 | Hitz et al. | |
| 6,006,308 A * | 12/1999 | Matsunami et al. | 711/114 |

(Continued)

FOREIGN PATENT DOCUMENTS

DE          694 25 658 T2       4/2001

(Continued)

OTHER PUBLICATIONS

IBM Technical Disclosure Bulletin, vol. 36 No. 03, Mar. 1993, "Parity Preservation for Redundant Array of Independent Direct Access Storage Device Data Loss Minimization and Repair". XP000354845.

(Continued)

Primary Examiner—Joseph D. Torres
(74) Attorney, Agent, or Firm—Swernofsky Law Group PC

(57) ABSTRACT

A method and apparatus for a reliable data storage system using block level checksums appended to data blocks. Files are stored on hard disks in storage blocks, including data blocks and block-appended checksums. The block-appended checksum includes a checksum of the data block, a VBN, a DBN, and an embedded checksum for checking the integrity of the block-appended checksum itself. A file system includes file blocks with associated block-appended checksum to the data blocks. The file blocks with block-appended checksums are written to storage blocks. In a preferred embodiment a collection of disk drives are formatted with 520 bytes of data per sector. For each 4,096-byte file block, a corresponding 64-byte block-appended checksum is appended to the file block with the first 7 sectors including most of the file block data while the 8th sector includes the remaining file block data and the 64-byte block-appended checksum.

18 Claims, 3 Drawing Sheets

U.S. PATENT DOCUMENTS

| | | | |
|---|---|---|---|
| 6,317,844 B1 | 11/2001 | Kleiman | |
| 6,637,007 B1 | 10/2003 | Bots | |

FOREIGN PATENT DOCUMENTS

| | | |
|---|---|---|
| EP | 0 462 917 A2 | 12/1991 |
| EP | 0 462 917 A3 | 12/1991 |
| EP | 0 462 917 B1 | 12/1991 |
| EP | 0 466 296 A2 | 1/1992 |
| EP | 0 492 808 A2 | 7/1992 |
| EP | 0 492 808 A3 | 7/1992 |
| EP | 0 559 488 A2 | 9/1993 |
| EP | 0 997 900 A2 | 5/2000 |
| EP | 0 702 815 B1 | 8/2000 |
| EP | 0 927 395 B1 | 5/2003 |
| JP | 07-261947 A | 7/1996 |
| WO | WO 94/29807 A1 | 12/1994 |
| WO | WO 03/009286 A2 | 1/2003 |

OTHER PUBLICATIONS

Steven R. Kleiman et al., "Using NUMA Interconnects for Highly Available Filers", Jan.-Feb. 1999. IEEE.

Jai Menon et al., "The Architecture of a Fault-Tolerant Cached RAID Controller", IEEE Computer Society Press, Los Alamitos, California, May 16-19, 1993. XP000398988.

Slashdot. Tux2: "The Filesystem That Would Be King", Oct. 17, 2000.

IBM. "Automated Problem Reporting." IBM Technical Disclosure Bulletin, Nov. 1989, pp. 466-468, vol. 32, no. 6A.

Kegel. "Apache Problem Report Database." http://bugs.apache.org/, May 24, 1999.

* cited by examiner

BLOCK-APPENDED CHECKSUMS

BACKGROUND OF THE INVENTION

1. Field of Invention

This invention relates to data storage systems.

2. Related Art

Many computer applications need to store and retrieve information. Information can be stored on hard disks, floppy disks, CD-ROMs, semiconductor RAM memory and similar storage devices. Many of these storage systems are susceptible to data loss of various forms including disk failures. A solution to the problem of disk failure involves use of a RAID (redundant array of independent disks) system. One style of RAID systems uses multiple hard drives to store parity data generated from the data drives, either on a separate drive (known as the parity disk) or spread out among the multiple drives. The use of multiple hard drives makes it possible to replace faulty hard drives without going off-line; data contained on a drive can be rebuilt using the other data disks and the redundant data contained in the parity disk. If a hard drive fails, a new hard drive can be inserted by "hot-swapping" drives while on-line. The RAID system can rebuild the data on the new disk using the remaining data disks and the redundant data of the parity disk. The performance of a RAID system is improved by disk striping, which interleaves bytes or groups of bytes across multiple drives, so more than one disk is reading and writing simultaneously. Files are broken into chunks of data known as file blocks and these file blocks are stored in one or more physical sectors of one or more hard disks. Each file block is a given size such as 4,096-bytes that takes up 8 sectors.

A first known problem with storage devices is that they are susceptible to data corruption. This data corruption includes bit flips, misdirected I/O, lost I/O, sector shifts, and block shifts. One style of RAID uses parity data to determine whether there has been corruption of some data included in a disk stripe. Parity is checked by comparing the parity value stored on disk against the parity values computed in memory. Parity is computed by taking the exclusive-OR (henceforth "XOR") of the blocks in the data stripe. If the stored and computed values of parity are not the same, the data may be corrupt. If a single disk block is incorrect, the RAID system includes enough data to restore the corrupted block by recalculating the corrupted data using the parity data and the remaining data in the data stripe. However, such RAID systems can not determine which disk includes the corrupt data from parity values alone. Although parity data is useful in determining whether corruption has occurred, it does not include enough information to restore the corrupted data. Moreover, it is unclear which data has been corrupted.

Checksums are another form of redundant data that can be written to individual disks. The combination of parity bits across the disks along with checksums and their associated information may include enough information so that the corrupted data can be restored in RAID and other redundant systems.

A second known problem involves using a sector checksum for each sector of data. A sector checksum is generated for each collection of data that can fill a sector. The data is stored in a disk sector, along with the associated sector checksum. Some known systems include reformatting a collection of hard disks from standard sector sizes such as 512-byte sectors to include sector checksums in each sector such as reformatting to 520-byte sectors. Data corruption in the disk sector can then be detected by using the sector checksum because the stored checksum would not match a computed checksum. However, data corruption such as sector slides, misdirected reads and writes, and lost sectors would not be detected at the disk sector level. For this type of corruption, a checksum computed from the sector data would match the stored checksum.

A third known problem is storing checksums in reserved locations separate from the associated data. A separate read or write operation of the checksum is required for every read or write operation of the associated data. This can result in performance loss in some workloads.

Accordingly, it would be advantageous to provide an improved technique for the error checking and correction of data storage systems. This is achieved in an embodiment of the invention that is not subject to the drawbacks of the related art.

SUMMARY OF THE INVENTION

The invention provides an improved method and apparatus for a reliable data storage system using block level checksums appended to data blocks.

In a first aspect of the invention, a block-appended checksum is created at the filesystem block level, where a block is the filesystem's unit of transfer. In a preferred embodiment, the data storage system is a RAID system composed of multiple hard disk drives, including a parity disk drive and a controller for the drives. Files are stored on hard disks in storage blocks, including data blocks and block-appended checksums. The block-appended checksum includes a checksum of the data block, a Virtual Block Number (VBN), a Disk Block Number (DBN), and an embedded checksum for checking the integrity of the block-appended checksum itself. The block-appended checksum reliably detects corruption of data within a sector such as bit flips, as does a sector checksum. However, a block-appended checksum also reliably detects data corruption across sectors including sector slides, misdirected reads and writes, and lost sector I/O.

The combination of (1) parity bits across the RAID system stored on the parity disk, (2) the remaining uncorrupted data in the data disks, and (3) block-appended checksum within each disk includes sufficient information so as to enable detection and restoration of corrupt data in RAID systems and other similar devices. Such a combination is preferable to using block-appended checksums alone because block-appended checksums are limited to detecting errors.

In a second aspect of the invention, a file system includes file blocks with associated block-appended checksum to the data blocks. The file blocks with block-appended checksums are written to storage blocks. In a preferred embodiment a collection of disk drives are formatted with 520 bytes of data per sector instead of the more commonly found 512 bytes per sector. For each 4,096-byte file block, a corresponding 64-byte block-appended checksum is appended to the file block. When this is written to disk, the first 7 sectors includes most of the file block data while the $8^{th}$ sector includes the remaining file block data and the 64-byte block-appended checksum for a total of 4,160-bytes of data. Because the block-appended checksums are appended to the file blocks, every read or write to a storage block includes the reading or writing of the file block and the block-appended checksum in a single operation. In known cases, this results in greatly improved performance.

In a third aspect of the invention, I/O operations are first stored in NVRAM (non-volatile random access memory). In the event of a system crash, I/O operations are replayed from NVRAM, which preserves file block data. When the I/O operation is performed again, the corresponding block-appended checksum information is simply recalculated.

In a preferred embodiment, the invention is operative on a RAID level 4 system for a file server. However, in other embodiments, the invention is applicable to any computer data storage system such as a database system or a store and forward system such as cache or RAM.

DETAILED DESCRIPTION OF THE PREFERRED EMBODIMENT

Figure 1:
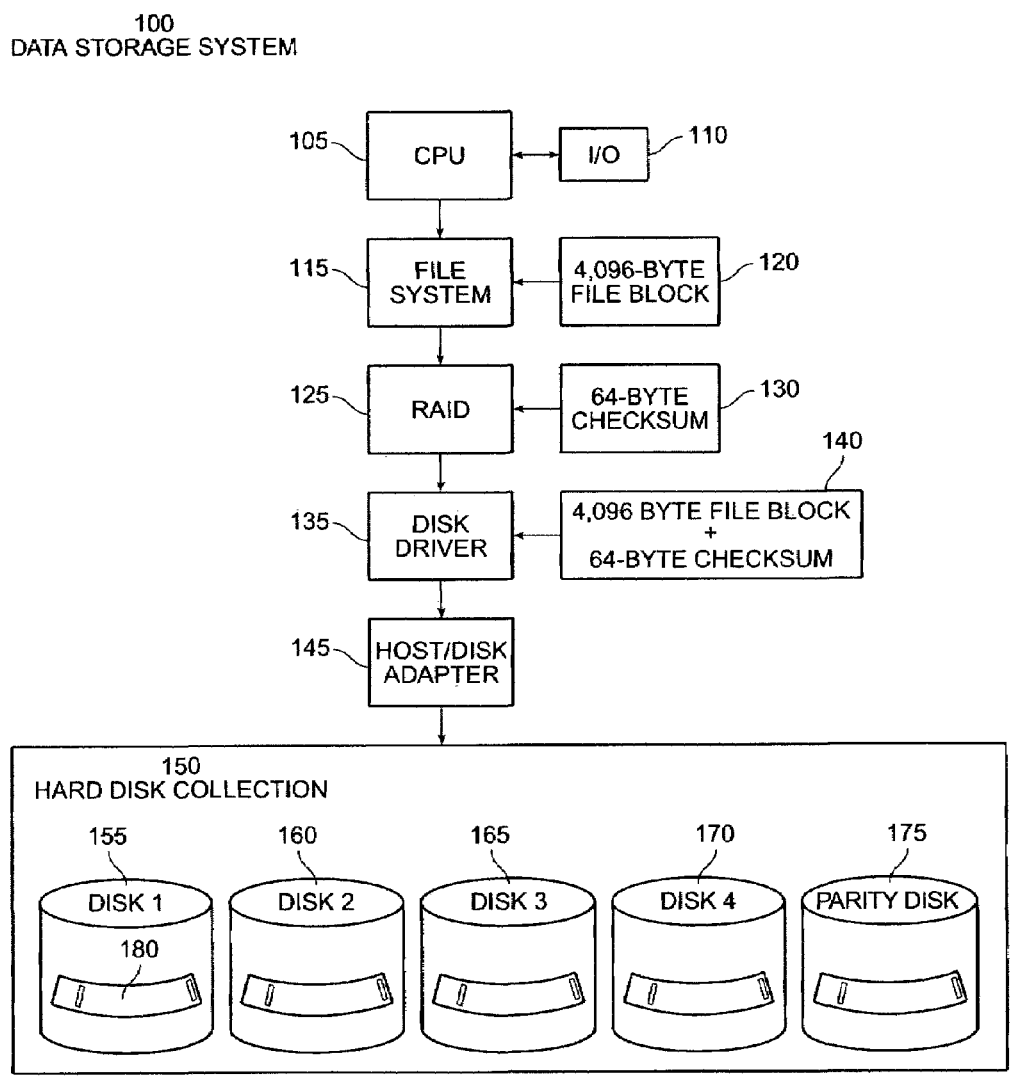
FIG. 1 shows a block diagram of a reliable, redundant data storage system including block-appended checksum.

In the following description, a preferred embodiment of the invention is described with regard to preferred process steps and structures. Those skilled in the art would recognize after perusal of this application that embodiments of the invention can be implemented using elements adapted to particular process steps and structures described herein, and that implementation of the process steps and structures described herein would not require undue experimentation or further invention.

INCORPORATED DISCLOSURES

The inventions described herein can be used in conjunction with inventions described in the following applications:

application Ser. No. 09/642,063, in the name of Blake LEWIS, Ray CHEN and Kayuri PATEL. filed on Aug. 18, 2000, Express Mailing Number EL524781089US, titled "Reserving File System Blocks", assigned to the same assignee, and all pending cases claiming the priority thereof.

U.S. patent application Ser. No. 09/642,062, in the name of Rajesh SUNDARAM, Srinivasan VISWANATHAN, Alan ROWE, Steven R. KLEIMAN and John EDWARDS filed Aug. 18, 2000, Express Mail Mailing No. EL524780242US, titled "Dynamic Data Space", assigned to the same assignee, filed Aug. 18, 2000, and all pending cases claiming the priority thereof.

application Ser. No. 09/642,066, in the name of Ray CHEN, John EDWARDS and Kayuri PATEL filed on Aug. 18, 2000, Express Mailing Number EL524780256US, titled "Manipulation of Zombie Files and Evil-Twin Files", assigned to the same assignee, and all pending cases claiming the priority thereof.

application Ser. No. 090/642,065, in the name of Doug DOUCETTE, Blake LEWIS and John EDWARDS, filed Aug. 18, 2000, Express Mailing Number EL524781092US, titled "Improved Space Allocation in a Write Anywhere File System", assigned to the same assignee, and all pending cases claiming the priority thereof.

application Ser. No. 09/642,061, in the name of Blake LEWIS, John EDWARDS, and Srinivasan VISWANATHAN, filed on Aug. 18, 2000, Express Mailing Number EL524780239US, titled "Instant Snapshot", assigned to the same assignee, and all pending cases claiming the priority thereof.

application Ser. No. 09/642,064, in the names of Scott SCHOENTHAL, filed Aug. 18, 2000, Express Mailing Number EL524781075US, titled "Persistent and Reliable Delivery of Event Messages", assigned to the same assignee, and all pending cases claiming the priority thereof.

Lexicography

As used herein, use of the following terms refer or relate to aspects of the invention as described below. The general meaning of these terms is intended to be illusory and in no way limiting.

Sector—In general, the term "sector" refers to a physical section of a disk drive including a collection of bytes, such as 512 or 520 bytes. This is the disk drive's minimal unit of transfer.

Storage block—In general, the term "storage block" refers to a group of sectors, such as 8 sectors or 4,096 bytes for 512 byte sectors or 4,160 bytes for 520 byte sectors.

Data block—In general, the term "data block" refers to a collection of bytes stored in a storage block, such as 4,096 bytes with 512-byte sectors or 4,160 bytes with 520-byte sectors each stored in 8 sectors.

Block-appended checksum—In general, the term "block-appended checksum" refers to a collection of bytes, such as 64 bytes, which may include a checksum of a data block, a Virtual Block Number (VBN), a Disk Block Number (DBN), and an embedded checksum for checking the integrity of checksum information itself.

Stripe—In general, the term "stripe" refers to the collection of blocks in a volume with the same DBN on each disk.

Volume—In general, the term "volume" refers to a single file system spread across multiple disks and associated disk drives. Known data storage systems have current size limits, such as greater than one terabyte and are included in multiple volumes.

DBN (Disk Block Number)—In general, the term "DBN" refers to a location of a particular block on a disk in a volume of a file system.

VBN (Volume Block Number)—In general, the term "VBN" refers to an integer that maps to a disk number and disk block number.

WAFL (Write Anywhere File Layout)—In general, a high level structure for a file system that is above RAID in hierarchy and includes metadata, such as one or more copies of the "fsinfo block" (file system information block) located at fixed locations on disk. Pointers are used for locating the remaining data. All the data except the fsinfo blocks are collected into files and these files can be written anywhere on the disk.

Parity checking—In general, the term "parity checking" refers to an error detection technique that tests the integrity of digital data within a computer system or over a network. Parity bits are checked by comparing them against computed values of parity, which are the XOR of the sets of data bits.

Parity disk—In general, the term "parity disk" refers to a separate disk drive that holds parity bits in a disk array, such as four data disks and one parity disk in a volume of a data storage system.

Parity protected—In general, the term "parity protected" refers to protection of a collection of data using parity bits. Data is parity protected if it has parity for an entire collection of data. In a preferred embodiment, parity computations can be made across bytes.

Checksum—In general, the term "checksum" refers to a value used to ensure data is stored or transmitted without error. This value is created by calculating the binary values in a block of data using some algorithm and storing the results with the data or at a separate location. When the data is retrieved from memory, received at the other end of a network, or retrieved from a computer storage system, a new checksum is computed and matched against the existing checksum. A mismatch indicates an error.

As described herein, the scope and spirit of the invention is not limited to any of the definitions or specific examples shown therein, but is intended to include the most general concepts embodied by these and other terms.

System Elements

FIG. 1 shows a block diagram of a reliable, redundant data storage system including block-appended checksums.

A data storage system 100 includes a controller CPU (central processing unit) 105, an I/O port 110, a file system 115, a RAID system 125, a disk driver 135, a host/disk adapter 145, a hard disk collection 150, including drive 155, drive 160, drive 165, drive 170 and parity drive 175.

A data storage system 100 is part of a larger computer system. The I/O port 110 is connected to the larger computer system in such a way that the controller CPU 105 can send data to and from the I/O port 110. The data is written to and read from the hard disk collection 150, including a parity disk 175 in a data storage system 100.

Unlike other parity systems that may require breaking up the bytes in a block of data or breaking up the block of data itself, each bit in the parity block is computed using the corresponding bits in the data blocks. Thus, if there are four blocks of data, one block would be put on a first drive 155, the second block would be put on drive 160, the third block would be put on drive 165 and the fourth block on drive 170. The parity block is computed using an XOR of the data blocks.

In a preferred embodiment, the five disk drives 155, 160, 165, 170 and 175 in a RAID system 125 include one or more volumes. A volume is a single file system in a data storage system. Each block has a unique VBN (volume block number) and DBN (disk block number). The VBN specifies the location of a block in a volume. The DBN specifies the location of a block in a disk. Therefore, more than one block can have the same DBN if they are in the same location on different disks. However, only one block can have a given VBN.

Known data storage systems format hard disks with 512-bytes per sectors. Prior art systems with checksums may include disks formatted with 520-byte sectors comprising 512-bytes of file block data and 8-bytes for a sector checksum. In a preferred embodiment, each disk in a hard disk collection 150 is formatted with 520-bytes per sector. Files are broken into fixed sizes of data known as file blocks. These file blocks are stored in one or more physical sectors of one or more hard disks such as 4,096-bytes that take up 8 sectors. With a hard disk formatted to 512-byte sectors, the file block fits into 8 sectors with no extra bytes remaining. With a hard disk formatted for 520-bytes per sector, the 4,096-byte file block fits into the 8 sectors with 64 bytes free for a block-appended checksum. The first 7 sectors contain only file block data while the $8^{th}$ sector includes the remaining file block data and ends with the 64-byte block-appended checksum. This 520-bytes per sector formatting approach allows the file block and checksum to be written or read in a single operation. The resulting block-appended checksum has an advantage over the prior art sector checksums in a 520-byte formatted hard disk because it can reliably detect sector data corruption such as sector slides, misdirected reads and writes, lost sectors and similar defects.

In a preferred embodiment, a series of software and hardware layers is required for reading and writing data between the CPU 105 and the hard disk collection 150. A file system 115 takes a relatively large data file and divides it into a group of file blocks of a given size such as 4,096-bytes. A RAID system stripes these file blocks across a collection of hard disks such as a hard disk collection 150 including four data disks, disk 1 155, disk 2 160, disk 3 165 and disk 4 170 plus a parity disk 175 that provides redundancy for the data High performance is accomplished using the RAID system by breaking the group of file blocks into four sub groups and striping these sub groups of blocks in parallel across the data disks. Each file block in a RAID system receives a block-appended checksum of a given size such as 64-bytes. The block-appended checksum is appended to the file block to produce a file block with a block-appended checksum of 4,160-bytes. The block-appended checksum information includes at least: a 4-byte checksum of the data block; a Virtual Block Number (VBN); a Disk Block Number (DBN); and a 4-byte embedded checksum for checking the integrity of the block appended checksum itself. Other embodiments may use other formats of data and algorithms other than Adler's. A sector checksum and a block-appended checksum reliably detect bit flips. However, only a block-appended checksum reliably detects sector data corruption including sector slides, misdirected reads and writes, and lost sectors.

In a preferred embodiment, the file system 115 allocates a collection of 4,096-byte buffers for each file block when writing a stripe of blocks to the hard disk collection 150. Each file block has the same DBN in a stripe provided the hard disk collection 150 is composed of equal sizes of hard disks. Each 4,096-byte file block 120 is written to a 4,096-byte buffer and sent to RAID 125. In RAID 125, each 4,096-byte buffer is appended with 64-bytes for a total block size of 4,160 bytes to accommodate the 64-byte block-appended checksum 130. The I/O operations are logged to NVRAM. If the system crashed after this point, the file blocks can be restored upon recovery from the crash by replaying the log of I/O operations from NVRAM. Each 4,096-byte file block plus 64-byte checksum 140 is sent to the disk driver 135. The disk driver 135 creates a scatter/gather list that provides instructions where host/disk adapter 145 should distribute each file block plus 64-byte checksum 140. The collection of buffers and the scatter/gather list are sent to the host/disk adapter 145. The host/disk adapter 145 then writes the stripe of file blocks with the block-appended checksums to the hard disk collection 150 including the four hard disks, disk 1 155, disk 2 160, disk 3 165, disk 4 170. The parity data is created from the stripe of file blocks and it is written onto the parity disk 175. A file block with block-appended checksum 180 is written to a storage block on disk 1 155 that is composed of 8 sectors of the disk. There is a single operation for writing the file block with appended checksum. The file block data fills all 8 sectors with space remaining in the last part of the last sector to hold the block-appended checksum. When a file is read, each file block and associated block-appended checksum is also done as a single operation. The stored block-appended checksum is compared with a computed block-appended checksum to validate the data. If the stored and computed block-appended checksums are not equivalent, the data has been corrupted and must be rebuilt using the remaining hard disks including the parity disk 175 in the hard disk collection 150.

Method of Use

Figure 2:
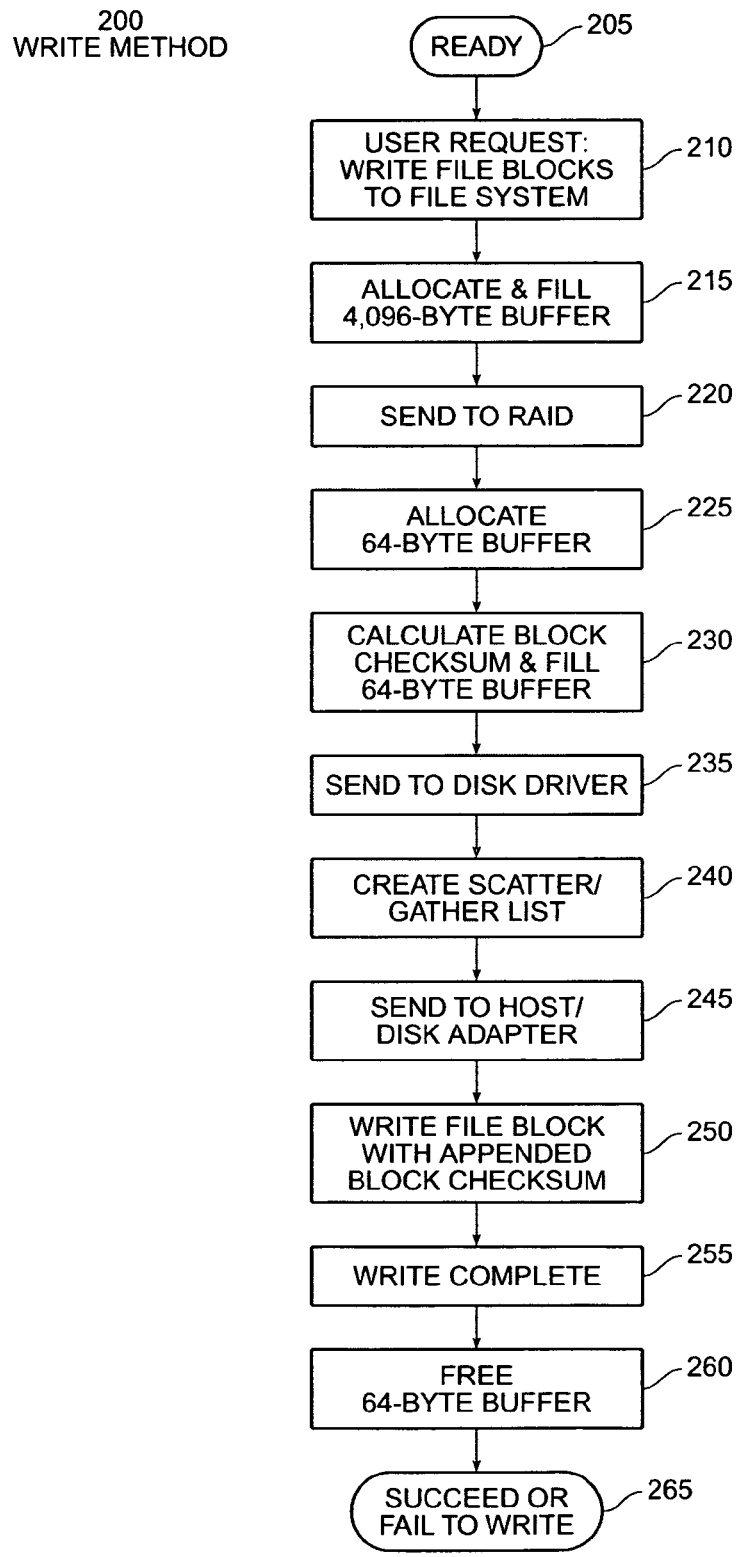
FIG. 2 shows a flow diagram of a method for writing file blocks with block-appended checksums to a reliable, redundant data storage system.

FIG. 2 shows a flow diagram of a method for writing file blocks with block-appended checksums to a reliable, redundant data storage system.

A method 200 is performed by the data storage system 100. Although the method 200 is described serially, the steps of the method 200 can be performed by separate elements in conjunction or in parallel, whether asynchronously, in a pipelined manner, or otherwise. There is no particular requirement that the method 200 be performed in the same order in which this description lists the steps, except where so indicated.

At a flow point 205, the data storage system 100 is ready to perform the method 200 to a file system 115 including writing file blocks and block-appended checksums. In the preferred embodiment the write method 200 requires formatting hard disks to 520 byte sectors.

At a step 210, the data storage system 100 receives a request from the user to write a file block to the file system 115.

At a step 215, the data storage system 100 allocates and fills a 4,096-byte buffer with a file block.

At a step 220, the data storage system 100 sends the filled 4,096-byte buffer to RAID 125.

At a step 225, the data storage system 100 allocates a 64-byte buffer in RAID 125.

At a flow point 230, the data storage system 100 computes a block-appended checksum for the 4,096-byte file block in the 4,096-byte buffer, fills the 64-byte buffer with the block-appended checksum and appends the 64-byte buffer to the 4,096-byte buffer.

At step point 235, the data storage system 100 sends the 4,096-byte file block buffer including the 64-byte block-appended checksum buffer to the disk driver 135.

At a step point 240, the data storage system 100 creates a scatter/gather list using the disk driver 135 to distribute the 4,096-byte file block with appended checksum to a group of sectors making up a storage block on one or more of the disks in the hard disk collection 150.

At a step 245, the data storage system 100 sends the 4,096-byte buffer, including the appended 64-byte buffer and the scatter/gather list to the host/disk adapter 145.

At a step 250, the data storage system 100 writes the file block with the block-appended checksum to a storage block in a single operation.

At a step 255, the data storage system 100 completes writing to one or more of the hard disks in the hard disk collection 150.

At a step 260, the data storage system 100 frees up the 64-byte buffer in RAID 125.

At a flow point 265, the data storage system 100 has succeeded or failed at writing a file to the file system.

Figure 3:
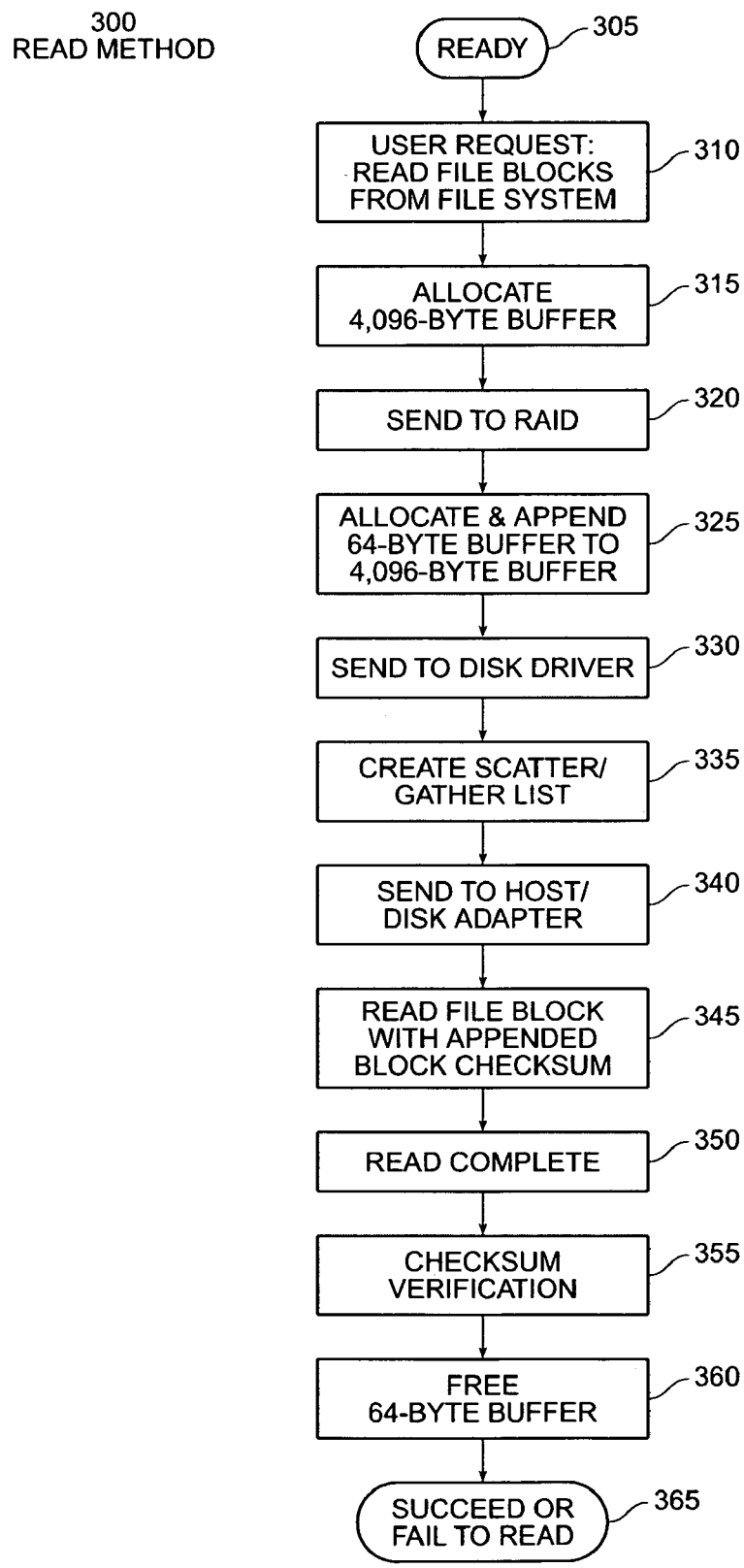
FIG. 3 shows a flow diagram of a method for reading data from data storage blocks including file blocks with block-appended checksums in a reliable, redundant data storage system.

FIG. 3 shows a flow diagram of a method for reading data from data storage blocks including file blocks with block-appended checksums in a reliable, redundant data storage system.

A read method 300 is performed by the data storage system 100. Although the read method 300 is described serially, the steps of the read method 300 can be performed by separate elements in conjunction or in parallel, whether asynchronously, in a pipelined manner, or otherwise. There is no particular requirement that the read method 300 be performed in the same order, in which this description lists the steps, except where so indicated.

At a flow point 305, the data storage system 100 is ready for requests to read file blocks from a file system 115, including reading file blocks and block-appended checksums.

At a step 310, the data storage system 100 receives a request from the user to read a file block to the file system. 115.

At a step 315, the data storage system 100 allocates a 4,096-byte buffer for a file block.

At a step 320, the data storage system 100 sends the empty 4,096-byte buffer to RAID 125.

At a step 325, the data storage system 100 allocates a 64-byte buffer in RAID 125 and appends it to the 4,096-byte buffer.

At a flow point 330, the data storage system 100 sends the 4,096-byte file block buffer with the 64-byte block-appended checksum buffer to the disk driver 135.

At a step point 335, the data storage system 100 creates a scatter/gather list in the disk driver 135 to collect the 4,096-byte file block from a group of sectors making up a storage block on one or more of the disks in the hard disk collection 150.

At a step 340, the data storage system 100 sends the 4,096-byte buffer with the appended 64-byte buffer along with the scatter/gather list to the host/disk adapter 145.

At a step 345, the data storage system 100 reads the file block with the block-appended checksum from a storage block in a single operation.

At a step 350, the data storage system 100 completes reading the file block with the block-appended checksum from one or more of the hard disks collection 150.

At a step 355, the data storage system 100 computes the block-appended checksum for the file block and compares it to the appended block-appended checksum to verify the file block.

At a step 360, the data storage system 100 frees up the 64-byte buffer in RAID 125.

At a flow point 365, the data storage system 100 has succeeded or failed at reading a file block from the file system 115.

ALTERNATIVE EMBODIMENTS

Although preferred embodiments are disclosed herein, many variations are possible which remain within the concept, scope, and spirit of the invention, and these variations would become clear to those skilled in the art after perusal of this application.

What is claimed is:

1. An apparatus that stores data and attempts to protect said data from storage errors, comprising
an array of disk drives, each of said disk drives having a plurality of storage blocks; and a controller that controls said array of disk drives;

wherein said controller controls storage of said data in said array of disk drives such that at least some of said storage blocks store at least part of said data and a block appended checksum that protects said part of said data from said storage errors, said block appended checksum including one or more checksums and one or more block numbers including at least a virtual block number and a disk block number, with at least one of said checksums being an embedded checksum that checks integrity of said block appended checksum; and wherein said block appended checksum provides sufficient data to detect sector slides and misdirected reads and writes.

2. The apparatus as in claim 1, wherein said one or more checksums include a first checksum for said data and said embedded checksum for said first checksum and said at least one of said block numbers.

3. The apparatus as in claim 2, wherein at least some of said storage blocks store parity data for those of said storage blocks that store said data, said one or more block numbers, and said one or more checksums.

4. The apparatus as in claim 3, wherein said parity data can be used to correct errors detected using said one or more checksums.

5. The apparatus as in claim 1, wherein said disk drives are hard disks.

6. The apparatus as in claim 1, wherein each of said storage blocks includes plural disk sectors.

7. The apparatus as in claim 6, wherein at least one of said one or more checksums for a storage block resides in one of the sectors of that storage block and is at least partially for data in others of the sectors in that storage block.

8. The apparatus as in claim 1, wherein said disk drives are part of a RAID storage device.

9. The apparatus as in claim 8, wherein said RAID storage device is a RAID level 4 device.

10. A method of storing data and attempting to protect said data from storage errors in an array of disk drives that each have a plurality of storage blocks, comprising steps of
determining a storage block for at least part of said data;
determining one or more block numbers for said storage block;
determining one or more checksums for said storage block; and
storing in said storage block said at least part of said data and a block appended checksum that protects said part of said data from said storage errors, said block appended checksum including said one or more checksums and said one or more block numbers including at least a virtual block number and a disk block number;

wherein at least one of said checksums is an embedded checksum that checks integrity of said block appended checksum; and wherein said block appended checksum provides sufficient data to detect sector slides and misdirected reads and writes.

11. The method as in claim 10, wherein said one or more checksums include a first checksum for said data and said embedded checksum for said first checksum and said at least one of said block numbers.

12. The method as in claim 11, further comprising a step of storing parity data in at least some of said storage blocks, said parity data for those of said storage blocks that store said data, said one or more block numbers, and said one or more checksums.

13. The method as in claim 12, wherein said parity data can be used to correct errors detected using said one or more checksums.

14. The method as in claim 10, wherein said disk drives are hard disks.

15. The method as in claim 10, wherein each of said storage blocks includes plural disk sectors.

16. The method as in claim 15, wherein at least one of said one or more checksums for a storage block resides in one of the sectors of that storage block and is at least partially for data in others of the sectors in that storage block.

17. The method as in claim 10, wherein said disk drives are part of a RAID storage device.

18. The method as in claim 17, wherein said RAID storage device is a RAID level 4 device.

* * * * *